United States Patent
Dao

(10) Patent No.: US 7,538,000 B2
(45) Date of Patent: May 26, 2009

(54) METHOD OF FORMING DOUBLE GATE TRANSISTORS HAVING VARYING GATE DIELECTRIC THICKNESSES

(75) Inventor: Thuy B. Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 516 days.

(21) Appl. No.: 11/193,675

(22) Filed: Jul. 28, 2005

(65) Prior Publication Data

US 2007/0023817 A1    Feb. 1, 2007

(51) Int. Cl.
*H01L 21/336* (2006.01)

(52) U.S. Cl. .................. 438/287; 438/157; 438/275; 438/591; 438/763

(58) Field of Classification Search ............ 438/283, 438/287, 158, 257, 406, 455, 459, 517, 588, 438/591, 156, 157, 163, 268, 761–763, 765, 438/769, 778, 981, 261, 275, 180, 229, 299, 438/749, FOR. 495
See application file for complete search history.

(56) References Cited

U.S. PATENT DOCUMENTS

| | | | | |
|---|---|---|---|---|
| 5,773,331 | A * | 6/1998 | Solomon et al. | 438/164 |
| 5,960,289 | A * | 9/1999 | Tsui et al. | 438/275 |
| 6,140,668 | A * | 10/2000 | Mei et al. | 257/66 |
| 6,251,754 | B1 * | 6/2001 | Ohshima et al. | 438/506 |
| 6,580,132 | B1 * | 6/2003 | Chan et al. | 257/365 |
| 6,734,113 | B1 * | 5/2004 | Cho et al. | 438/763 |
| 6,784,506 | B2 * | 8/2004 | Xiang et al. | 257/410 |
| 6,946,713 | B2 * | 9/2005 | Gonzalez et al. | 257/411 |
| 6,995,424 | B2 * | 2/2006 | Lee | 257/324 |
| 7,018,873 | B2 * | 3/2006 | Dennard et al. | 438/149 |
| 2004/0087159 | A1 * | 5/2004 | Kim et al. | 438/690 |
| 2004/0219753 | A1 * | 11/2004 | Ohno | 438/275 |
| 2005/0070160 | A1 * | 3/2005 | Cohen et al. | 439/608 |
| 2005/0095783 | A1 * | 5/2005 | Haselden et al. | 438/257 |
| 2005/0282318 | A1 * | 12/2005 | Dao | 438/151 |
| 2007/0004146 | A1 * | 1/2007 | Prinz et al. | 438/261 |
| 2007/0264784 | A1 * | 11/2007 | Wolstenholme et al. | 438/275 |

OTHER PUBLICATIONS

T. Dao, "Manufacturing Method to Construct Semiconductor-on-Insulator with Conductor Layer Sandwiched Between Buried Dielectric Layer and Semiconductor Layer," U.S. Appl. No. 10/971,657, filed Oct. 22, 2004.

* cited by examiner

*Primary Examiner*—Matthew Smith
*Assistant Examiner*—Joseph C Nicely
(74) *Attorney, Agent, or Firm*—Hamilton & Terrile, LLP; Michael Rocco Cannatti

(57) ABSTRACT

Double gate transistors (12, 13) having different bottom gate dielectric thicknesses are formed on a first wafer (101) by forming a first gate dielectric layer (107); removing part of the first gate dielectric layer (107) from a first area (60); forming a second gate dielectric layer (108) to obtain a thinner bottom gate dielectric layer (150) over the first area (60) and a thicker bottom gate dielectric layer (151) over the second area (70); and forming a planar bottom gate layer (109) over first and second gate dielectric layers. After inverting and bonding the first wafer (101) to a second wafer (103), the bottom gate electrodes (109-2, 109-3), bottom gate dielectric layers (107, 108) and channel regions (203-2, 203-3) for the first and second double gate transistors (12, 13) are selectively etched prior to formation of the top gate structures.

10 Claims, 8 Drawing Sheets

METHOD OF FORMING DOUBLE GATE TRANSISTORS HAVING VARYING GATE DIELECTRIC THICKNESSES

BACKGROUND OF THE INVENTION

1. Field of the Invention

The present invention is directed in general to the field of semiconductor devices. In one aspect, the present invention relates to gate dielectric layers formed on integrated circuit devices.

2. Description of the Related Art

As the size of semiconductor device is scaled down, the requirements for device design and fabrication—such as controlling the thickness of thin gate dielectric and other constituent layers and/or obtaining desired dielectric film composition—continue to be tightened. In addition, scaled down conventional bulk silicon MOSFET devices tend to have diminished gain in drive currents while having increased adverse short channel effects. Double gate Fully Depleted Semiconductor-on-Insulator (FDSOI) technology has been established as one solution to reduce short channel effect as well as to improve drive current (high transconductance). In addition, double gate FDSOI technology may require a less stringent requirement on the thickness of a semiconductor on insulator, and may reduce the Drain Induced Virtual Substrate Biasing (DIVSB) effect. However, it has been difficult to build a simple, manufacturable planar double gate FDSOI transistor structure that can be used to fabricate transistors in differing applications.

Accordingly, there is a need for improved semiconductor device structure and manufacturing process to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
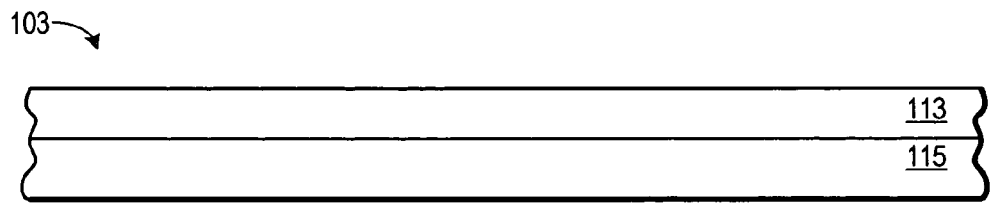
FIG. 1 is a partial cross-sectional view of a handling wafer structure in which an insulator layer is formed over a handling wafer substrate.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating planar double gate devices having multiple possible gate dielectric thicknesses so that, for example, double gate devices used in one part of an integrated circuit have a first bottom gate dielectric, a first bottom gate conductor and an optional first top gate dielectric layer and first top gate conductor layer, while double gate devices used in another part of an integrated circuit have a second bottom gate dielectric, a second bottom gate conductor and an optional second top gate dielectric layer and second top gate conductor layer. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid obscuring the present invention. Such descriptions and representations are used by those skilled in the art to describe and convey the substance of their work to others skilled in the art.

The present invention includes a method of forming bottom gate dielectric layers having a plurality of precisely controlled thicknesses. Under the method, a first bottom gate dielectric layer is formed of a dielectric material (such as silicon dioxide, nitrided silicon oxide, nitride, metal oxide or multi-metal oxide) on a semiconductor substrate structure using any desired technique, such as chemical vapor deposition (CVD) techniques, physical vapor deposition (PVD) techniques, atomic layer deposition (ALD) techniques, or any other technique for depositing or growing material in a layer. After forming the first bottom gate dielectric layer, a photoresist pattern is applied to mask off a first circuit area (such as defined by the circuit designer). The exposed (unmasked) first bottom gate dielectric layer in a second circuit area is then cleared from the semiconductor substrate structure by applying an etchant, such as an aqueous solution of HF or HCl. After stripping the photoresist, a second bottom gate dielectric layer is formed using any desired technique for depositing or growing a dielectric layer. The second bottom gate dielectric layer thereby defines a thin bottom gate dielectric for devices formed in the second circuit area, while the combination of the first and second bottom gate dielectric layers define a thicker bottom gate dielectric for devices in the first circuit area(s).

In another embodiment which removes the need for selective etching of the first bottom gate dielectric layer, a patterned nitride layer may be formed over the first bottom gate dielectric layer, and then used as mask during the formation of the second bottom gate dielectric layer to prevent formation of the second bottom gate dielectric layer in the area protected by the patterned nitride layer. When the patterned nitride layer is subsequently removed, the area beneath the patterned nitride layer defines a thinner bottom gate dielectric, while the remaining areas define a thicker bottom gate dielectric.

With the disclosed techniques, planar double gate FDSOI transistors may be fabricated having different gate dielectric thicknesses to meet differing applications, such as I/O, SRAM, core logic, analog, non-volatile memory (NVM), high performance and low power applications. For example, the disclosed fabrication techniques may be used to build on a single chip logic transistors having a thin bottom gate oxide and memory device transistors having a thick bottom gate oxide including bottom gate conductor with optional thin top gate oxide, thick top gate oxide, and top gate conductor layers.

Various illustrative embodiments of the present invention will now be described in detail with reference to FIGS. 1-17. It is noted that, throughout this detailed description, certain layers of materials will be deposited, grown, etched, masked and/or removed to form the double gate structure. Where the specific procedures for forming such layers or thicknesses of such layers are not detailed below, conventional techniques to one skilled in the art for depositing, growing, etching, masking or otherwise forming such layers at appropriate thicknesses shall be intended. Such details are well known and not considered necessary to teach one skilled in the art of how to make or use the present invention.

FIG. 1 is a partial cross-sectional view of a portion of a handling wafer structure 103 in which an insulator layer is formed over a first substrate. In particular, the wafer structure 103 includes a first substrate 115. Depending on the type of transistor device being fabricated, the first substrate 115 may be implemented as a bulk insulator substrate, a bulk metal substrate, a bulk silicon substrate, single crystalline silicon (doped or undoped), semiconductor-on-insulator (SOI) substrate, a multi-layered composite film wafer substrate or any semiconductor material including, for example, Si, SiC, SiGe, SiGeC, Ge, GaAs, InAs, InP as well as other Group III-IV compound semiconductors or any combination thereof.

The wafer structure 103 includes an optional insulator layer 113 formed (e.g. grown or deposited) on the first substrate 115. The insulator layer 113 may be implemented as silicon dioxide or some low-k dielectric material, but may include other materials such as, e.g. PSG, FSG, silicon nitride, and/or other types of dielectric, including low-K dielectric materials with high thermal conductivity for cooling. As described below, the insulator layer 113 may be used for silicon wafer bonding and/or to form a buried oxide (BOX) layer for silicon-on-insulator devices.

In some embodiments, wafer 103 includes a metal layer (not shown) embedded at a location in the middle of insulator 113 that is formed with an optional patterning process step. In one embodiment, the metal layer is an electrically grounded shield conductor plate that is formed from the bottom gate layer or a metal layer formed by an additional metal layer that is patterned and embedded in the handle wafer structure 103, such as silicon handle wafer with BOX, metal, and insulator layers at the top surface. This metal layer may be used for performance enhancement, such as for noise reduction in analog devices built from the final wafer (described below), electrical interconnection line, and other applications.

Figure 2:
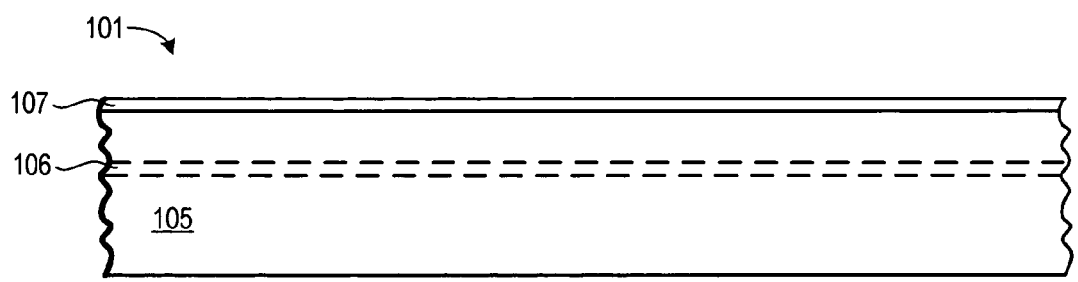
FIG. 2 is a partial cross-sectional view of a donor wafer structure in which a first bottom gate dielectric layer is formed over a donor wafer substrate.

FIG. 2 is a partial cross-sectional view of a donor wafer structure 101 in which a first bottom gate dielectric layer 107 is formed over first semiconductor substrate structure 105. Depending on the type of transistor device being fabricated, the first semiconductor substrate structure 105 may be implemented as a channel layer of (doped or undoped) monocrystaline silicon, strained silicon, or any semiconductor material including, for example, Si, SiC, SiGe, SiGeC, Ge, GaAs, InAs, InP as well as other Group III-IV compound semiconductors or any combination or any multi-layers combination thereof on bulk silicon, bulk insulator, or SOI substrate wafer. This channel layer will form a conductive channel of the double gate transistor devices described below.

The wafer structure 101 includes first bottom gate dielectric layer 107 formed (e.g. grown or deposited or etched back) on the channel layer of the first semiconductor substrate structure 105. The first bottom gate dielectric layer 107 may be implemented as silicon dioxide or hafnium oxide (preferably $HfO_2$), though other oxides, silicates or aluminates of zirconium, aluminum, lanthanum, strontium, titanium or combinations thereof may also be used, including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also be used, as may oxynitride, hafnium oxynitride, iridium oxynitride and/or other high-k dielectric materials in either single or composite layers from the materials listed above.

As depicted in FIG. 2, the wafer structure 101 includes a cleave layer 106 formed by implanting a dopant (e.g. H+) into the first semiconductor substrate structure 105. In some embodiments, the dopant is implanted prior to the formation of the first bottom gate dielectric layer 107, but in other embodiments, the dopant may be implanted at other times, including after the formation of the first bottom gate dielectric layer 107.

Figure 3:
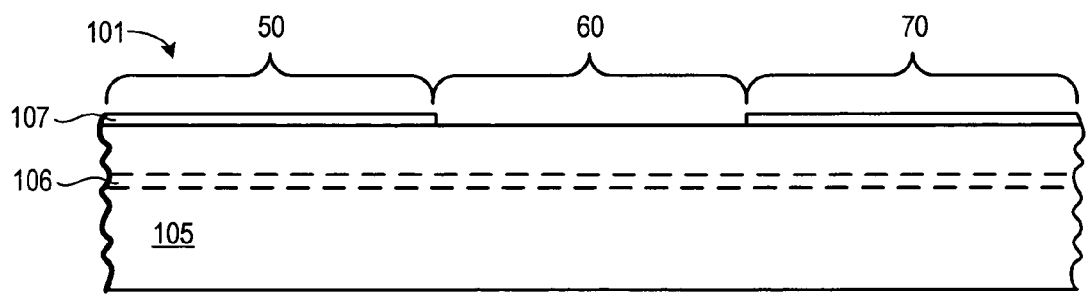
FIG. 3 illustrates processing subsequent to FIG. 2 in which a first bottom gate dielectric layer has been selectively etched.

FIG. 3 illustrates the processing of a donor wafer structure 101 subsequent to FIG. 2 in which a first bottom gate dielectric layer 107 has been removed from a first circuit area 60 using a etch process, such as an HF etch. Not shown in the view of FIG. 3 is the patterned photoresist mask that is formed over the first bottom gate dielectric layer 107 that is located in a second circuit area 50 and third circuit area 70, and then stripped and cleaned after the exposed first bottom gate dielectric layer 107 has been etched. In an alternative embodiment, the first bottom gate dielectric layer 107 depicted in FIG. 3 may be formed after a layer of nitride is deposited, patterned and etched to form a nitride mask (not shown) over the first circuit area 60, thereby defining an opening over the substrate structure 105 in the first circuit area 60.

Figure 4:
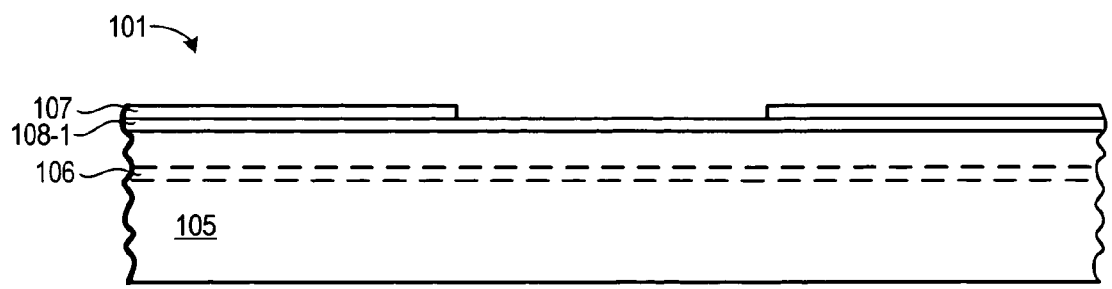
FIG. 4 illustrates processing subsequent to FIG. 3 in which a second bottom gate dielectric layer is formed on the donor wafer substrate.

FIG. 4 illustrates the processing of a donor wafer structure 101 subsequent to FIG. 3 in which a second bottom gate dielectric layer 108-1 is formed on the donor wafer structure 101 by growing a film layer, such as oxide. As illustrated in FIG. 4, the second bottom gate dielectric layer 108-1 may be formed by growing a layer of silicon dioxide or some other low-k dielectric material so that the material for the new dielectric layer 108-1 is created at the surface of the first semiconductor substrate structure 105, both below the first bottom gate dielectric layer 107 and in the exposed first circuit area 60.

Figure 5:
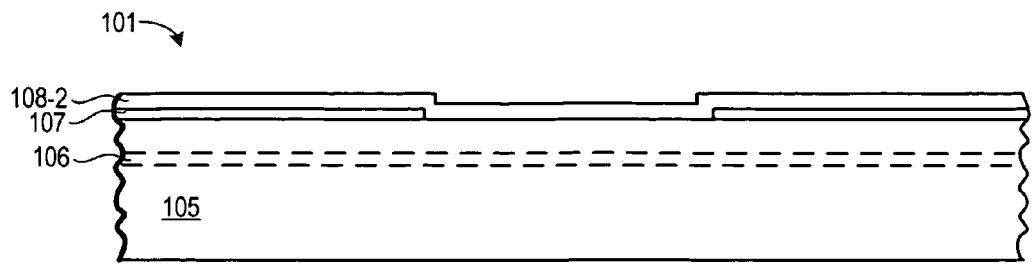
FIG. 5 illustrates an alternate processing embodiment subsequent to FIG. 3 in which a second gate dielectric layer is formed on the donor wafer substrate.

Alternatively, FIG. 5 illustrates the processing of a donor wafer structure 101 subsequent to FIG. 3 in which a second bottom gate dielectric layer 108-2 is formed on the donor wafer structure 101 by depositing a film layer, such as hafnium oxide. As illustrated, the second bottom gate dielectric layer 108-2 may be formed by depositing a dielectric layer over the layer 107 of donor wafer structure 101, such as a metal-oxide compound formed, e.g., by chemical vapor deposition or by atomic layer deposition. In some embodiments, the same material is used to form the first and second bottom gate dielectric layers 107, 108. With either formation process, the net result is to increase the overall thickness of the bottom gate dielectric in the second and third circuit areas 50, 70 (e.g., anywhere from approximately 10-100 angstroms in thickness), while obtaining a thinner bottom gate dielectric in the first circuit area 60 (e.g., anywhere from approximately 5-100 angstroms in thickness).

As will be appreciated, the sequence of masking, etching, stripping and forming gate dielectric may be repeated as necessary in order to obtain the desired relative thicknesses for the bottom gate dielectric layers in the first and second circuit areas, or in other circuit areas as well. For example, it is also possible to obtain three or more different thicknesses for the bottom gate dielectric layers by selectively masking and/or etching the dielectric layers. In addition, different gate dielectric materials may also be used for the constituent layers 107, 108 of the bottom gate dielectric layer.

Figure 6:
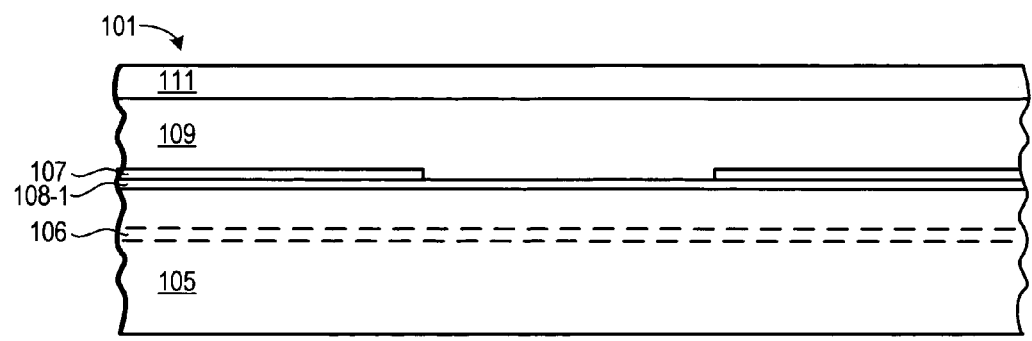
FIG. 6 illustrates processing subsequent to FIG. 4 in which a planar bottom gate conductor layer is formed on the donor wafer substrate.

FIG. 6 illustrates the processing of a donor wafer structure 101 subsequent to FIG. 4 in which a planar bottom gate conductor layer 109 is formed on the donor wafer substrate 101. In particular, the layer of bottom gate conductor material 109 is deposited on combined bottom gate dielectric layers 107, 108-1 (where layer 108-1 is depicted in FIG. 6 as being grown after the formation and selective etching of layer 107).

The bottom gate layer 109 may be implemented with doped polysilicon, but may be made of other conductor materials, such as amorphous silicon, tungsten, tungsten silicon, germanium, amorphous germanium, titanium, titanium silicon, titanium silicon nitride, tantalum, tantalum silicon, tantalum silicon nitride, other silicide materials, other metals, or combinations thereof including multiple layers of different conductive materials. Given the relative thickness of the bottom gate layer 109 (e.g., 1000 to 1200 angstroms) to the bottom gate dielectric layer(s) (e.g., 10-20 angstroms), the bottom gate layer 109 may optionally be planarized, such as by using a chemical mechanical polishing (CMP) process, and/or reflow annealing.

In addition, a dielectric or insulator 111 may optionally be formed (e.g. grown or deposited) on bottom gate layer 109. In one embodiment, insulator 111 includes silicon dioxide, but may include other materials, such as PSG, FSG, silicon nitride, and/or other types of dielectric including low-K dielectric materials with high thermal conductivity.

Figure 7:
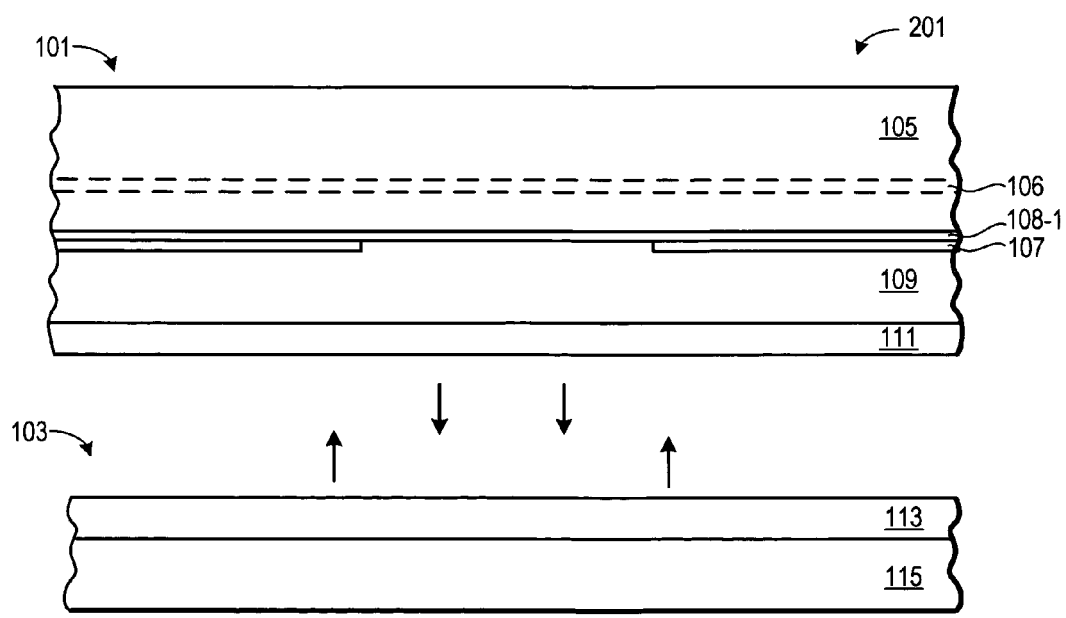
FIG. 7 illustrates processing subsequent to FIG. 6 with a side view of a handling wafer and a donor wafer being bonded together to form a resultant wafer where the donor wafer has been flipped over for bonding.

FIG. 7 illustrates a side view of the handling wafer structure 103 and donor wafer structure 101 being bonded together to form a resultant wafer 201. As depicted, the donor wafer structure 101 is shown to be flipped over so as to be bonded to the handle wafer structure 103. The donor wafer structure 101 includes an optional bonding insulator layer 11, a layer 109 of bottom gate material, combined bottom gate dielectric layers 107, 108-1, and first semiconductor substrate structure 105. In a selected embodiment, the handling wafer structure 103 and donor wafer structure 101 are bonding together using one or more insulator layers 111, 113. For example, the insulator 111 may be bonded to the insulator 113 with a bonding material. In other embodiments, the donor wafer structure 101 may be bonded to the handle wafer structure 103 using other bonding techniques, such as by performing electrostatic bonding, followed by thermal bonding or pressure bonding. In the alternative, the handle wafer structure 103 may not include the insulator 113, and instead the insulator 111 on the donor wafer structure 101 is bonded directly to substrate 115 of the handle wafer structure 103. In similar fashion, the donor wafer structure 101 may not include the insulator 111, and instead the insulator 113 on the handling wafer structure 103 is bonded directly to substrate 109 of the donor wafer structure 101. In another similar fashion, both insulators 111 and 113 may not be included when the substrate 115 itself is an insulator.

Figure 8:
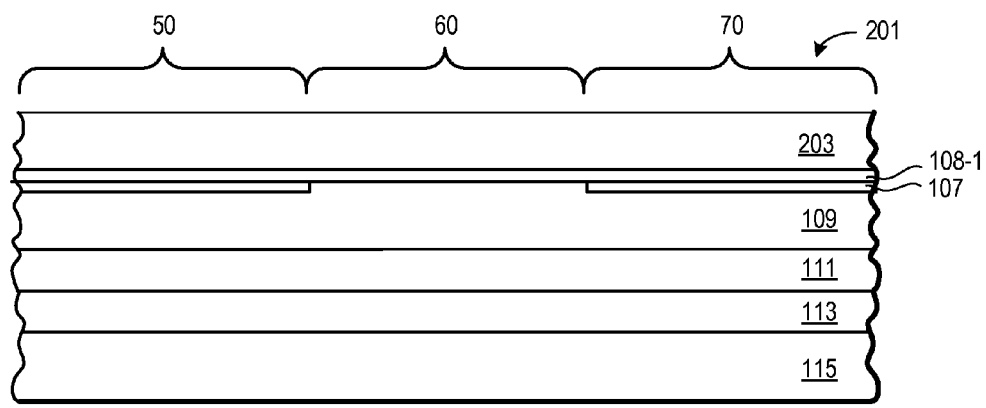
FIG. 8 illustrates processing subsequent to FIG. 7 with a side view of one embodiment of a resultant wafer according to various embodiments of the present invention after wafer bonding.

FIG. 8 illustrates a side view of one embodiment of a resultant wafer 201 which is used to fabricate FDSOI transistors after the donor wafer structure 101 and handle wafer structure 103 have been bonded together and after the top portion of first semiconductor substrate structure 105 has been removed by, for example, cleaving. Such cleaving is typically performed by dividing the first semiconductor substrate structure 105 along cleaving layer 106. Channel layer 203 is the portion of the first semiconductor substrate structure 105 which remains after cleaving and follow up surface smoothing and layer thickness adjustment process, such as CMP, thermal oxidation, etch back, deposition, epitaxial grow, annealing, reflow and others. Furthermore, by using the method of additional mask and etching, one or more selected circuit area(s), such as 50, can have thinner channel layer thickness. One advantage of forming the channel region layer by cleaving is that it may allow for a channel region to be formed and maintained from a relatively pure and crystalline structure of the first semiconductor substrate structure 105, as opposed to a semiconductor layer that is grown or deposited on a dielectric (e.g., gate conductor layer 109).

As described below, the material for the bottom gate conductor layer of double gate transistors is located in layer 109; the material for the bottom gate dielectric layer(s) of double gate transistors is located in layers 107, 108-1; and the material for the channel layer of double gate transistors to be formed is located in substrate 203.

As for the top gate dielectric layer or layers for the top gates of double gate transistors, these are subsequently fabricated over the channel layer 203 using the method of forming bottom gate dielectric layers 107, 108-1 and 108-2. And the top gate conductor layer for the top gates of double gate transistors is subsequently fabricated over the top gate dielectric layer(s) using the method of forming bottom gate conductor layer 109.

As described herein, planar double gate devices on an integrated circuit may be fabricated with different bottom gate dielectric layers (e.g., layers 107, 108-1) to meet the differing transistor performance requirements for different circuit areas. Thus, on a single integrated circuit, a method and structure are provided for fabricating FDSOI transistors having a plurality of different bottom and top gate dielectric layers for different applications, such as for multi-Vdd, multiple threshold voltage, low leakage, low-power, high performance and analog applications. By fabricating an integrated circuit with FDSOI transistors having one threshold voltage for a first circuit area or operation, and with different FDSOI transistors having another threshold voltage for a second circuit area or operation, the performance and power consumption of the integrated circuit may be optimized.

Figure 9A:
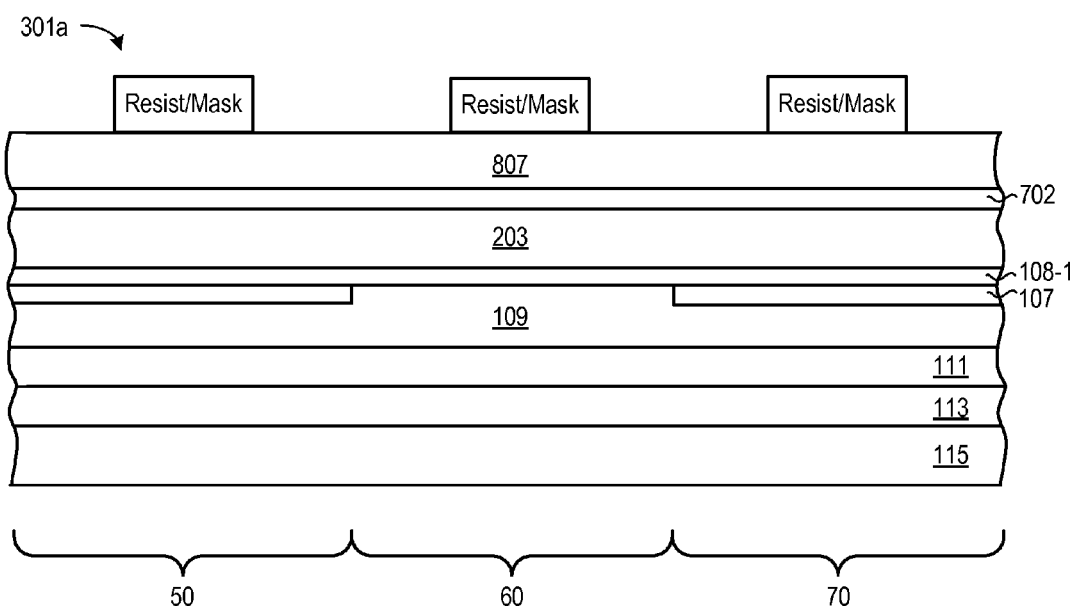
FIG. 9 illustrates processing subsequent to FIG. 8 with a partial cross-sectional side view of an example wafer on which first and second double gate transistors are formed on the wafer at a later stage in its manufacture in accordance with various embodiments of the present invention.
Figure 9B:
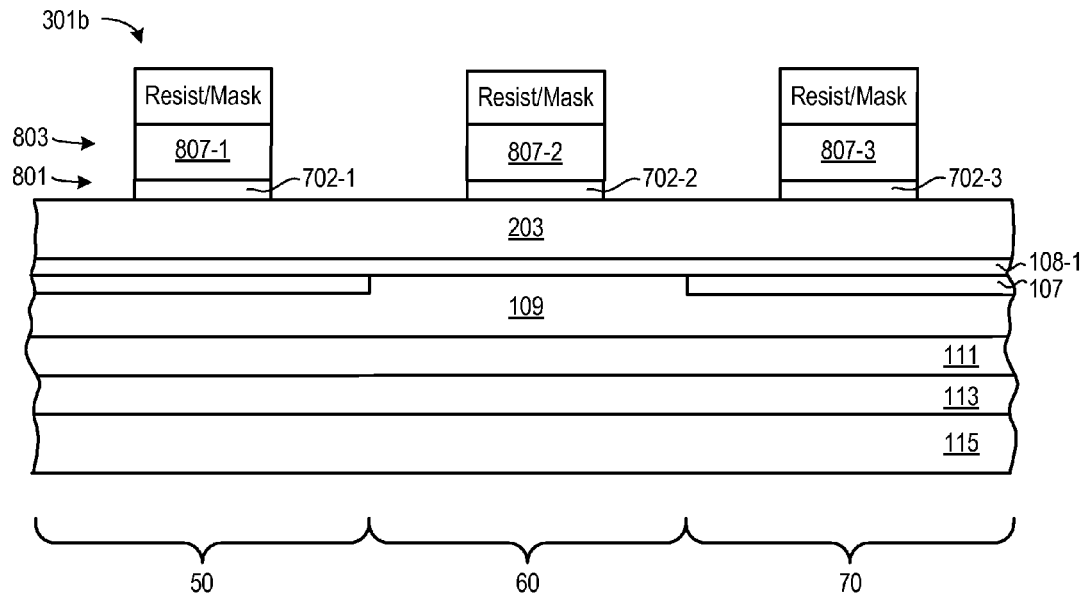
Figure 9C:
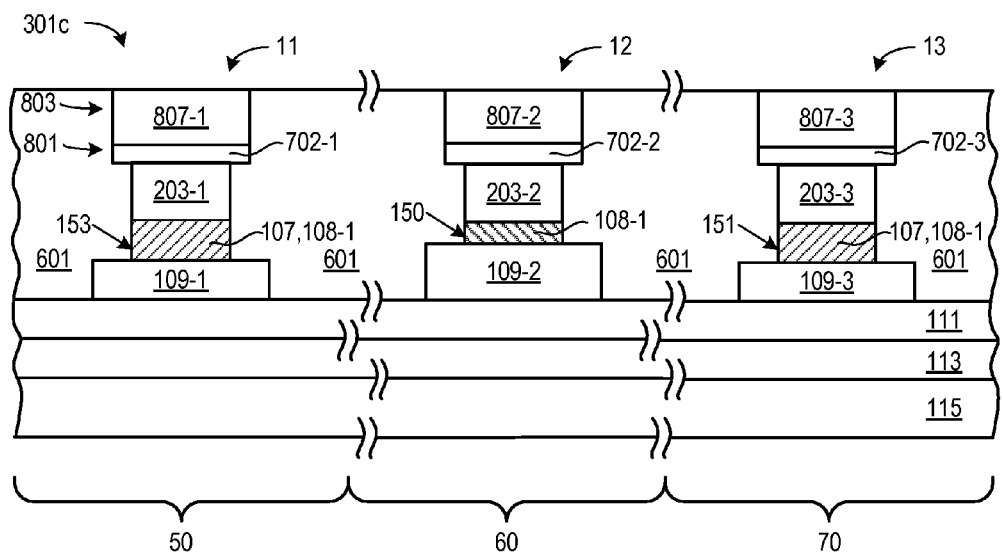

FIG. 9 illustrates a partial cross-sectional side view of an example wafer structure 301 subsequent to FIG. 8 on which partially completed first, second and third double gate transistors 11, 12, 13 are formed at a later manufacturing stage. In particular, the wafer structure 301 includes a first FDSOI transistor structure 12 (in the first circuit area 60) and a second FDSOI transistor structure 11 (in the second circuit area 50). In addition, the wafer structure 301 may optionally include a third FDSOI transistor structure 13 (in the circuit area 70). As depicted, each circuit area is laterally displaced from the other circuit areas, which reflects that a first circuit area might be used for one type of circuitry (e.g., logic or low power) while another circuit area might be used for another type of circuitry (e.g., SRAM, flash memory or non-volatile memory).

At the stage depicted in FIG. 9, the bottom gate conductor layer 109 has been patterned and etched to form the bottom gate conductors 109-2, 109-1, 109-3 for the first, second and third FDSOI planar double gate transistor structures 11, 12 or 13, respectively. In addition, the bottom gate dielectric layer(s) 107, 108-1 have been patterned and etched to form the bottom gate dielectric layers for the first, second and third FDSOI transistor structures. As described herein, each FDSOI transistor structure has a top gate (e.g., top gate conductor 807-1, 807-2 or 807-3 with top gate dielectrics 702-1, 702-2 or 702-3 for transistor 11, 12 or 13, respectively), a channel region (e.g., channel layer 203-1, 203-2 or 203-3 for transistor 11, 12 or 13, respectively) and a bottom gate (e.g., bottom gate conductors 109-1, 109-2 or 109-3 and bottom gate dielectric 153, 150 or 151 for transistor 11, 12 or 13, respectively), where each top or bottom gate may have a different gate dielectric layer thickness and/or may be formed of different materials. The channel layer 203 has also been patterned and etched to form the channel region 203-2, 203-1, 203-3 for the first (12), second (11) and third (13) FDSOI transistor structures, respectively. By forming the channel layer 203 from the first semiconductor substrate structure 105 as described at FIGS. 7 and 8, a substantially planar surface is provided on the resultant wafer 201 for the subsequent fabrication of the top gate structures and patterning the individual bottom gate and channel.

One or more top gate dielectric layers 702 and a top gate conductor layer 807 have been formed over the wafer structure 301, with or without using a hardmask layer, such as nitride. Then, using photoresist masking process, each gate is selectively masked and etched to form top gate conductors 803 (e.g., 807-1, 807-2, and 807-3) and top gate dielectrics 801 (e.g., 702-1, 702-2 and 702-3), respectively, for each FDSOI transistor (e.g., 11, 12, and 13). Then, the channels (203), bottom gate dielectrics (153, 150, 151), and bottom gate conductors (109) are patterned through self-aligned etching and spacer formation by using their respective top gate conductors (803) and dielectrics (801) as a hardmask for the patterning. As a result, a first double gate transistor 12 includes a bottom gate conductor (bottom gate electrode) 109-2, a thinner or a different material bottom gate dielectric 150 (layer 108-1), a channel region 203-2, a top gate dielectric layer 702-2, and a top gate conductor (top gate electrode) 807-2. Likewise, a second double gate transistor 13 includes a bottom gate conductor 109-3, a thicker or different material bottom gate dielectric 151, a channel region 203-3, a top gate dielectric 702-3, and a top gate conductor 807-3. Additional transistor structures (e.g., 11) having the same or different top and bottom gate dielectric layer thicknesses and/or materials 702-1 and 153 may also be formed by further processing the dielectric layers of the circuit area 50 until the desired thicknesses and/or materials for the dielectric layers 153 and 702-1 are formed. In addition or as a result, the channel layers may also be fabricated with different thicknesses on the different double gate transistor devices.

The areas around all the bottom gate conductors, bottom gate dielectrics, top gate conductors, top gate dielectrics, and channel regions are then filled with an isolation layer of dielectric 601 (e.g., deposited silicon oxide, TEOS, or CVD oxide) which may be subsequently planarized for subsequent interconnection and other processing.

Figure 10:
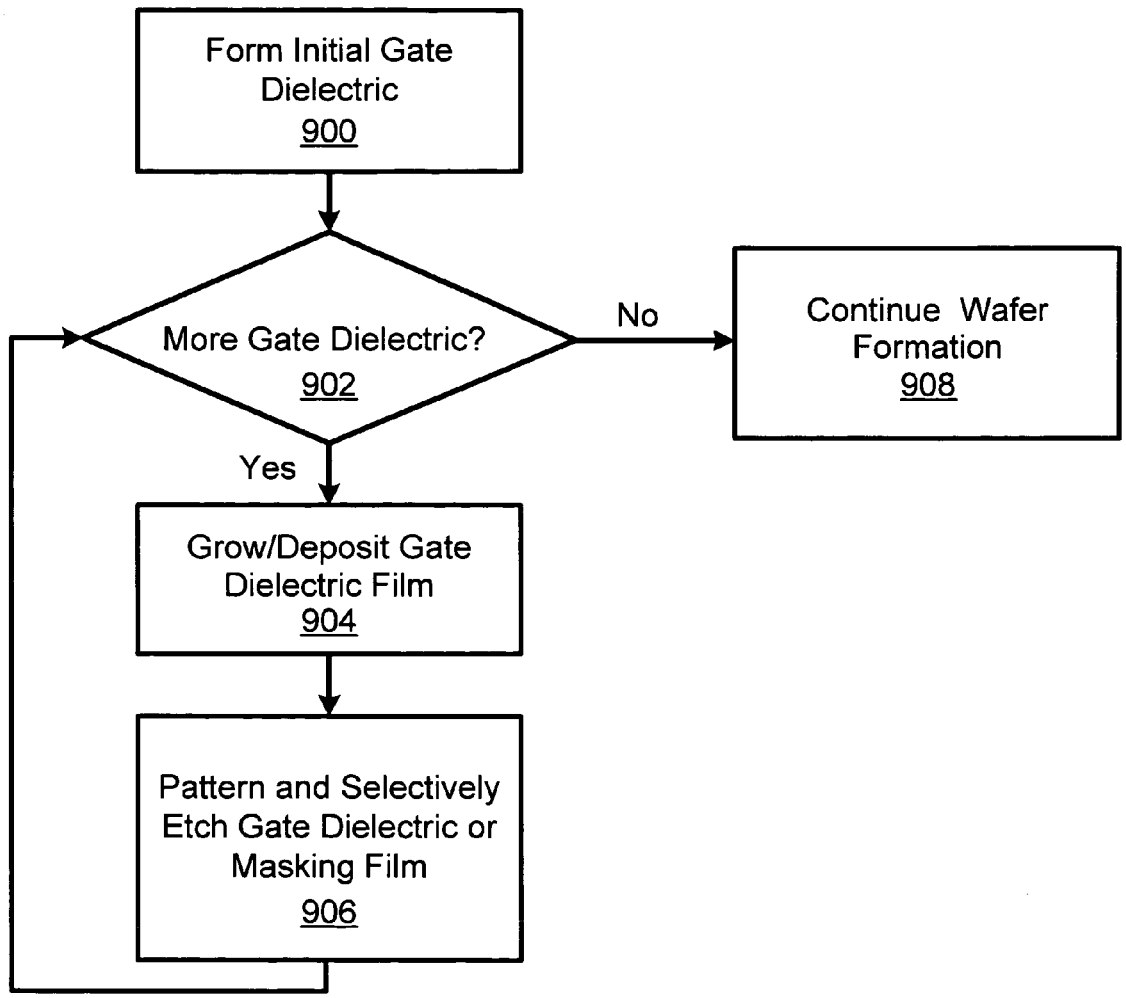
FIG. 10 illustrates an example process flow for forming a plurality of gate dielectric thicknesses in accordance with various embodiments of the present invention.

For example, FIG. 10 illustrates an example process flow for forming a plurality of gate dielectric thicknesses and/or materials in accordance with various embodiments of the present invention. Under the process, an initial gate dielectric layer is formed at step 900, either by growing or depositing the initial layer, then followed by patterning through etching, masking, and photo lithography processing step(s). As will be appreciated, the initial layer may be a single layer, composite layer, or may have been previously formed as a bottom gate dielectric layer having two different thicknesses and/or materials. Next, the process flow determines whether additional gate dielectric is required to thicken and/or to provide different materials for one or more of the bottom gate dielectric layers to the different double gate transistors. If no additional thickness or material is required (negative outcome to decision 902), then the rest of the wafer formation steps are performed (e.g., forming the bottom gate conductor material, bonding the donor wafer to the handle wafer, wafer cleaving, channel layer thinning, top gate layers, transistor gate patterning, interconnection, and the rest of the wafer processing), beginning at step 908. However, if additional thickness and/or material is required for any gate dielectric layers (affirmative outcome to decision 902), then an additional gate dielectric film is deposited over the initial gate dielectric layer (with or without patterned masking layers covered, such as nitride mask) at step 904. In addition or in the alternative, or an additional gate dielectric film may be grown under the initial gate dielectric layer at step 904. After forming the additional gate dielectric film layer, the gate dielectric film layers are patterned and selectively etched at step 906. The process flow then loops back to determine at step 902 whether additional gate dielectric is required. In this way, the process loop is repeated until the desired thicknesses and/or materials for the gate dielectric layers in all the circuit areas are obtained as the result of the accumulated gate dielectric formation steps 904. Using this same process, different gate dielectric layer thicknesses and/or materials in all the circuit areas are obtained by masking off the other circuit area(s) (step 906) from the gate dielectric formation step (step 904). Using the similar process flow, different gate dielectric materials can be used to form the gate dielectric layers for the bottom gate and, through the follow up processing, the top gate dielectrics. In addition, different thicknesses can also be obtained for the channel layer between the bottom gate and the top gate dielectrics at the different circuit areas.

Figure 11:
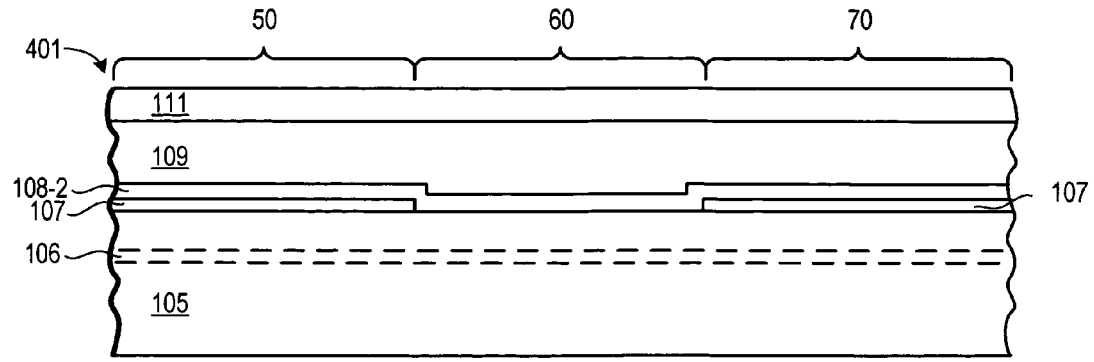
FIG. 11 illustrates processing subsequent to FIG. 5 in which a planar bottom gate conductor layer is formed on the donor wafer substrate.

As will be appreciated, planar double gate devices may also be formed using other fabrication techniques to make bottom gate dielectric layers having different thicknesses and/or materials. For example, with reference to the cross-section depicted in FIG. 5, FIG. 11 illustrates the processing of a donor wafer structure 401 subsequent to FIG. 5 in which a planar bottom gate conductor layer 109 is formed on the donor wafer substrate 401. In particular, a planar bottom gate conductor layer 109 is formed by depositing a conductor material layer on the second bottom gate dielectric layer 108-2, which is itself formed on the donor wafer structure by depositing a film layer, such as hafnium oxide or silicon dioxide, over the first bottom gate dielectric layers 107 and exposed substrate structure 105 in the circuit area 60. As a result, the bottom gate dielectric in the second and third circuit areas 50, 70 (which is formed from layers 107 and 108-2) is thicker and/or different material compared to the bottom gate dielectric in the first circuit area 60 (which is formed from layer 108-2). After an optional planarization of the bottom gate layer 109, a dielectric or insulator 111 may optionally be formed (e.g. grown or deposited) on bottom gate layer 109.

Figure 12:
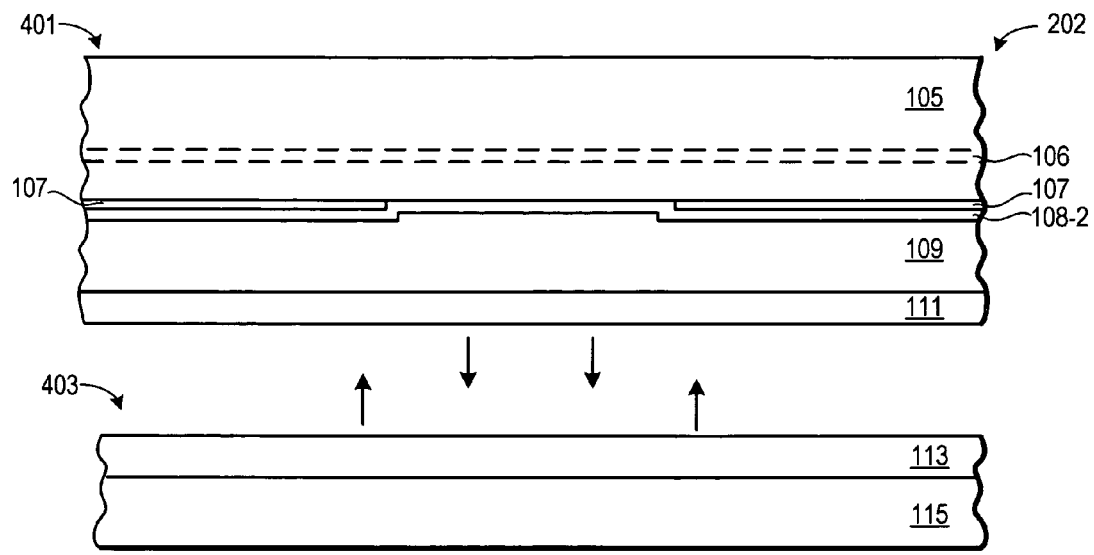
FIG. 12 illustrates processing subsequent to FIG. 11 with a side view of a handling wafer and a donor wafer being bonded together to form a resultant wafer, where the donor wafer has been flipped over for bonding.

FIG. 12 illustrates processing subsequent to FIG. 11 with a side view of the handling wafer structure 403 and donor wafer structure 401 being bonded together to form a resultant wafer 202. As depicted, the donor wafer structure 401 is shown to be flipped over so as to be bonded to the handle wafer structure 403 using none, one or more bonding insulator layers 111, 113.

Figure 13:
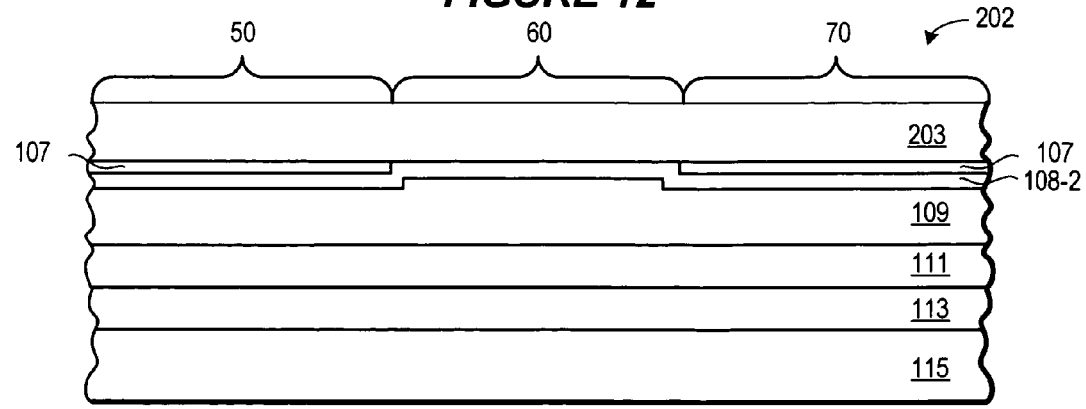
FIG. 13 illustrates processing subsequent to FIG. 12 with a side view of one embodiment of a resultant wafer according to various embodiments of the present invention after wafer bonding.

FIG. 13 illustrates processing subsequent to FIG. 12 with a side view of one embodiment of a resultant wafer 202 which is used to fabricate FDSOI transistors after the donor wafer structure 401 and handle wafer structure 403 have been bonded together and after the top portion of first substrate structure 105 has been removed by, for example, cleaving, leaving only a channel layer 203. As described herein, the material for the bottom gate conductor layer of double gate transistors is located in layer 109; the material for the bottom gate dielectric layer(s) of double gate transistors is located in layers 107, 108-2; and the material for the channel layer of double gate transistors to be formed is located in substrate 203.

As for the top gate dielectric layer or layers for the top gates of double gate transistors, these are subsequently fabricated over the channel layer 203. And the top gate conductor layer for the top gates of double gate transistors is subsequently fabricated over the top gate dielectric layer(s).

Figure 14:
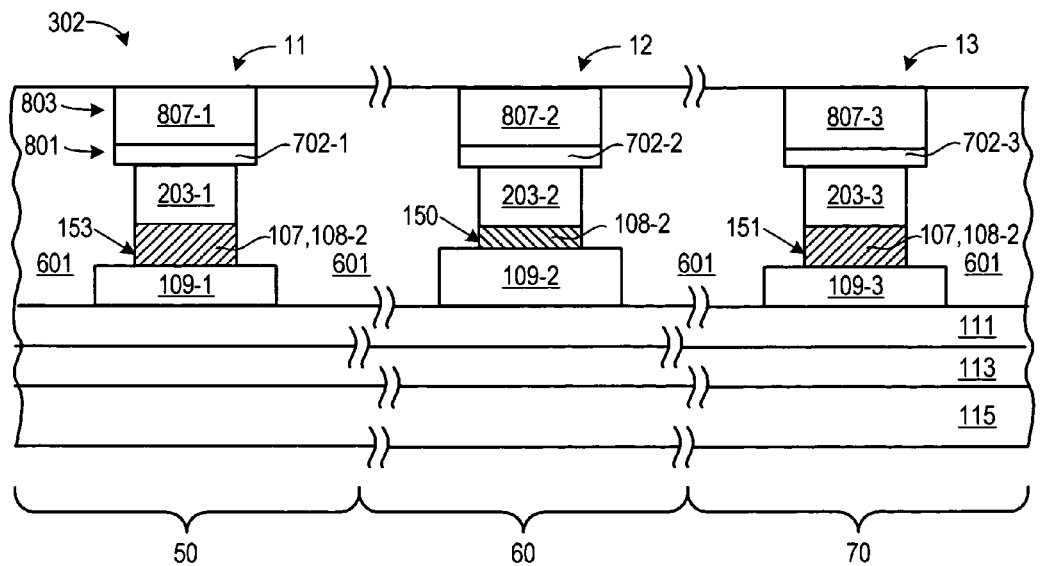
FIG. 14 illustrates processing subsequent to FIG. 13 with a partial cross-sectional side view of an example wafer on which first and second double gate transistors are formed on the wafer at a later stage in its manufacture in accordance with various embodiments of the present invention.

An example is depicted in FIG. 14, which illustrates processing subsequent to FIG. 13 with a partial cross-sectional side view of an example wafer structure 302 on which partially completed first, second and third double gate transistors 11, 12, 13 are formed at a later manufacturing stage. In particular, the wafer structure 302 includes a first FDSOI transistor structure 12 (in the first circuit area 60) and a second FDSOI transistor structure 11 (in the second circuit area 50). In addition, the wafer structure 302 may optionally include a third FDSOI transistor structure 13 (in the circuit area 70). As depicted, each circuit area is laterally displaced from the other circuit areas, which reflects that a first circuit area might be used for one type of circuitry (e.g., logic) while another circuit area might be used for another type of circuitry (e.g., SRAM, flash memory or non-volatile memory).

At the stage depicted in FIG. 14, the bottom gate conductor layer 109 has been patterned and etched to form the bottom gate conductors 109-2, 109-1, 109-3 for the first, second and third FDSOI planar double gate transistor structures, respectively. In addition, the bottom gate dielectric layer(s) 107, 108-2 have been patterned and etched to form the bottom gate dielectric layers for the first, second and third FDSOI transistor structures, and in addition, the top gate structures and channel region structures are formed over the bottom gate structures. Upon completion, each FDSOI transistor structure has a top gate (e.g., top gate conductor 807-1 and top gate dielectric 702-1), a channel region (e.g., channel layer 203-1) and a bottom gate (e.g., bottom gate conductor 109-1 and bottom gate dielectric 153), where each top or bottom gate may have a different gate dielectric layer thickness and/or may be formed of different materials. In particular, a first double gate transistor 12 includes a bottom gate conductor (electrode) 109-2, a thinner and or different material bottom gate dielectric layer 150 that is formed from the second bottom gate dielectric layer 108-2, a channel region 203-2, a top gate dielectric layer 702-2, and a top gate conductor (electrode) 807-2. Likewise, a second double gate transistor 13 includes a bottom gate conductor (electrode) 109-3, a thicker and or different material bottom gate dielectric layer 151 that is formed from a combination of first and second bottom gate dielectric layer(s) 107, 108-2, a channel region 203-3, a top gate dielectric layer 702-3, and a top gate conductor (electrode) 807-3. Additional transistor structures (e.g., 11) having the same or different bottom gate dielectric layer thicknesses and or different material 153 may also be formed by further processing the dielectric layer of the circuit area 50 until the desired thickness and or different material for the dielectric layer 153 is formed.

Figure 15:
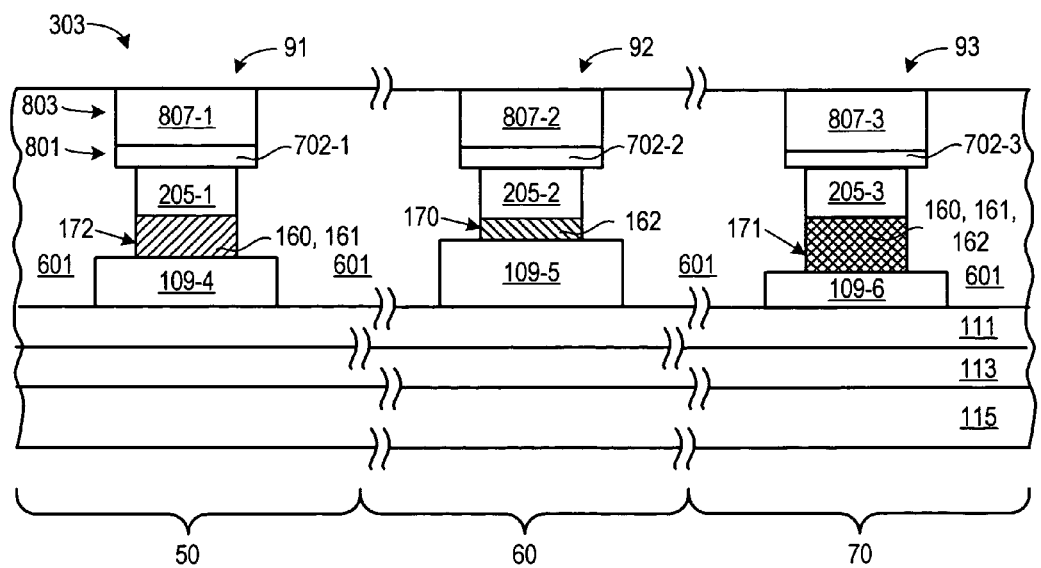
FIG. 15 illustrates a partial cross-sectional side view of an example wafer on which first, second and third double gate transistors are formed on the wafer at a later stage in its manufacture in accordance with various embodiments of the present invention.

In accordance with various embodiments of the present invention, a first double gate transistor may be formed with a first bottom gate dielectric layer (e.g., from the last-formed bottom gate dielectric layer 108-2), while the second double gate transistor is formed with a second bottom gate dielectric layer (e.g., from layers 107 and 108-2). However, it will be appreciated that the methodology of the present invention permits other thicknesses and/or materials to be obtained for other double gate transistors, as illustrated in FIG. 15, which shows a partial cross-sectional side view of an example wafer structure 303 on which partially completed first, second and third double gate transistors 91, 92, 93 are formed. In particular, the wafer structure 303 includes a first FDSOI transistor structure 92 (in the first circuit area 60), a second FDSOI transistor structure 91 (in the second circuit area 50), and a third FDSOI transistor structure 93 (in the circuit area 70). As depicted, each circuit area is laterally displaced from the other circuit areas, which reflects that a first circuit area might be used for one type of circuitry (e.g., logic or low power) while another circuit area might be used for another type of circuitry (e.g., SRAM, flash memory or non-volatile memory).

At the stage depicted in FIG. 15, the bottom gate layer 109 has been patterned and etched to form the bottom gate conductors 109-5, 109-4, 109-6 for the first, second and third FDSOI planar double gate transistors, respectively. In addition, the bottom gate dielectric layer(s) 160, 161, 162 have been patterned and etched to form the bottom gate dielectric layers for the first, second and third FDSOI transistor, as described herein. Subsequently, the top gate and channel region are formed over the bottom gate. Upon completion, each FDSOI transistor has a top gate (e.g., top gate conductor 807-1 and top gate dielectric 702-1), a channel region (e.g., channel region 205-1) and a bottom gate (e.g., bottom gate conductor 109-4 and bottom gate dielectric 153), where each top or/and bottom gate may have a different gate dielectric layer thickness and/or may be formed of different materials. In particular, a first double gate transistor 92 includes a bottom gate conductor (electrode) 109-5, a bottom gate dielectric layer 170 (that is formed from a last-formed or third bottom gate dielectric layer 162), a channel region 205-2, a top gate dielectric layer 702-2, and a top gate conductor (electrode) 807-2. Likewise, a second double gate transistor 91 includes a bottom gate conductor (electrode) 109-4, a bottom gate dielectric layer 172 that is formed from a combination of earlier formed (e.g., first and second) bottom gate dielectric layer(s) 160, 161, a channel region 205-1, a top gate dielectric layer 702-1, and a top gate conductor (electrode) 807-1. Lastly, a third double gate transistor 93 includes a bottom gate conductor (electrode) 109-6, a bottom gate dielectric layer 171 that is formed from a combination of all (e.g., first, second and third) bottom gate dielectric layer(s) 160, 161, 162, a channel region 205-3, a top gate dielectric layer 702-3, and a top gate conductor (electrode) 807-3.

To obtain the structure depicted in FIG. 15, the second double gate transistor 91 would be masked off from additional bottom gate dielectric layer formation once the first bottom gate dielectric layers (e.g., layer 160, 161) were formed for the second double gate transistor 91. At the point when the second double gate transistor 91 is masked off (not shown in FIG. 15), the first double gate transistor 92 has a bottom gate dielectric layer formed from a single dielectric layer 162, while the second and third double gate transistors 91, 93 have a bottom gate dielectric layer formed from layers 160, 161 and 162. After selectively etching the bottom gate dielectric layer 162 from the first double gate transistor 92 (but not the third double gate transistor 93) and forming a third bottom gate dielectric layer 162 over the first and third bottom gate transistors 92, 93, the resulting bottom gate dielectric layer 170 for the first double gate transistor 92 is thinner than the other transistors since it is formed from a single dielectric layer 162. As for the second double gate transistor 91, its bottom gate dielectric layer 172 has an intermediate thickness since it is formed from two, but not all, of the dielectric layers. And the third double gate transistor 93 has the thickest bottom gate dielectric layer 171 since it is formed from all three dielectric layers 160, 161, 162. With these different bottom gate dielectric thicknesses, the thicknesses of the respective bottom gate conductors (electrodes) 109-4, 109-5, 109-6 will correspondingly be adjusted by virtue of the bottom gate conductor formation process (which involves depositing and planarizing a conductor material) so as to provide a substantially planar surface at the interface between the bottom gate electrode 109 and the underlying dielectric layer 111.

Figure 16:
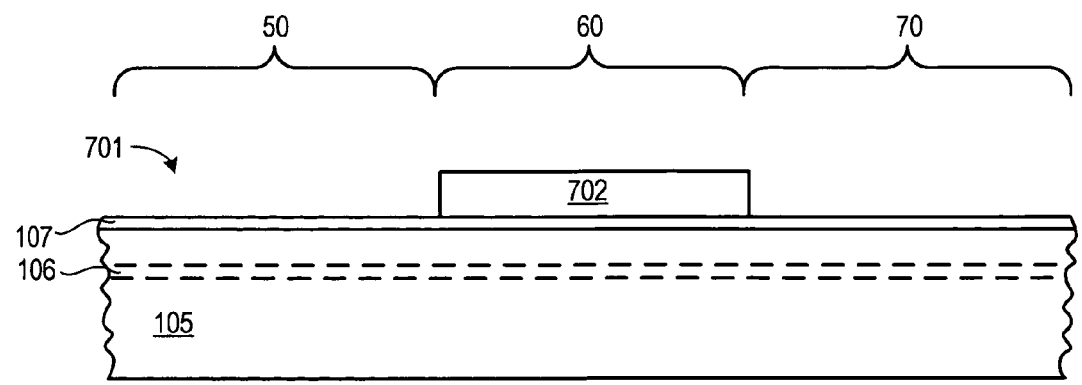
FIG. 16 illustrates an alternate processing embodiment subsequent to FIG. 2 in which a patterned nitride mask is formed on the first bottom gate dielectric layer.

Turning now to FIG. 16, yet another processing embodiment for fabricating multi-gate dielectric thicknesses is illustrated to show processing of a donor wafer structure 701 subsequent to FIG. 2 in which a patterned nitride mask is formed on the first bottom gate dielectric layer. As illustrated, a nitride layer is deposited over the first bottom gate dielectric layer 107, and is then patterned and etched to form the nitride mask 702 over a first circuit area 60.

Figure 17:
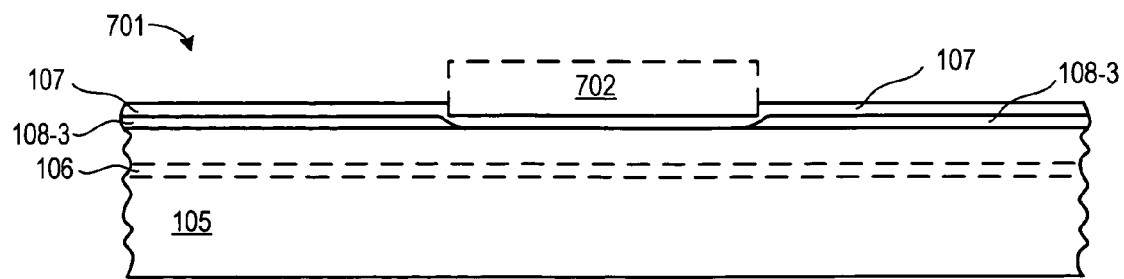
FIG. 17 illustrates processing subsequent to FIG. 16 in which a second bottom gate dielectric layer is formed on the donor wafer substrate where there is opening in the patterned nitride mask.

FIG. 17 illustrates processing of a donor wafer structure 701 subsequent to FIG. 16 in which a second bottom gate dielectric layer 108-3 is formed on the donor wafer substrate by growing a film layer, such as oxide, and then the nitride mask 702 is removed (as indicated by the dashed lines). As illustrated generally in FIG. 17, the second bottom gate dielectric layer 108-3 grows beneath the first bottom gate dielectric layer 107, except where the nitride mask 702 prevents the dielectric growth mechanism from occurring at the surface of the substrate structure 105. As illustrated in this embodiment, the use of a nitride mask 702 removes the need for selective etching of the first bottom gate dielectric layer. By using a nitride mask during the formation of the second bottom gate dielectric layer, formation of the second bottom gate dielectric layer is prevented in the area protected by the patterned nitride layer. As will be appreciated, the nitride masking technique may also be used to form a plurality of bottom and/or gate dielectric layer(s) with different materials and/or thicknesses on the same substrate, alone or in combination with the other techniques disclosed herein.

Those skilled in semiconductor fabrication will appreciate that different process steps (not depicted) may be used to complete the fabrication of first and second gate conductors for double gate transistors. As examples, one or more sacrificial oxide formation, deposit, epitaxial growth, stripping, masking, etch back, extension implant, halo type implant, spacer formation, source/drain implant, reflow and polishing steps may be performed to complete the double gate transistors. In addition, conventional backend processing (not depicted) typically including multiple levels of interconnect is then required to connect the transistors in a desired manner to achieve the desired functionality. Thus, the specific sequence of steps used to complete the fabrication of the double gate transistors may vary, depending on the process and/or design requirements. For example, additional processing details for completing the fabrication of the FDSOI transistors are set forth in U.S. patent application Ser. No. 10/871,402 entitled "Method of Forming a Transistor with a Bottom Gate" (filed on Jun. 18, 2004 and assigned to Freescale Semiconductor, Inc., the assignee of the present application), which is hereby incorporated by reference in its entirety as if fully set forth herein.

In one form, there is provided herein a method for building a planar double gate device with FDSOI transistors having multiple gate dielectric thicknesses and/or different materials to provide multiple threshold voltages and/or other transistor parameters for different circuit areas. On a donor wafer, multiple bottom gate dielectric thicknesses and/or materials may be obtained by forming (e.g., depositing or growing) a first dielectric layer, with or without masking layer (e.g., patterned silicon nitride) deposition, using a masking layer to pattern or to define a first circuit area (e.g., the SOI active area or another area), etching the exposed first dielectric layer (e.g., with an HF dip) or the masking layer (e.g., patterned silicon nitride), stripping the resist, and forming (e.g., depositing or growing) a second dielectric layer, with or without masking layer, over the entire donor wafer to thicken the gate dielectric all areas.

In another form, there is provided herein a method for making double gate transistors on an integrated circuit having a plurality of circuit areas. After a first wafer having a semiconductor substrate is provided, a first gate dielectric layer (e.g., silicon oxide, hafnium oxide, some high-k dielectric or composite multi-layers) is formed (e.g., deposited or grown) over first and second circuit areas on the semiconductor substrate, and then patterned with a first mask layer to leave the first gate dielectric layer over the first circuit area and, optionally, to remove the first gate dielectric layer from the second circuit area, such as by using an HF dip. After removing some or all of the mask layers, a second gate dielectric layer is formed on the first and second circuit areas. With this process, the first and second gate dielectric layers over the first circuit area form a first bottom gate dielectric layer, while the second gate dielectric layer over the second circuit area form a second bottom gate dielectric layer. The process can also be used to form bottom gate dielectric layers from three or more dielectric layer formation steps, and to form different bottom gate dielectric layer thicknesses and/or materials for three or more different circuit areas. After the desired bottom gate dielectric layer thicknesses and/or materials are formed, a layer of bottom gate conductor material (e.g., polysilicon or a metal gate stack) is formed over the first and second bottom gate dielectric layers. The resulting structure is then inverted by flipping over this donor wafer and bonded to a handle wafer (second wafer), such as a substrate structure formed under a first insulator layer or some other multi-layered composite film wafer substrate that may optionally include a noise reduction shielding conductor plate and/or conductor layer. With the resulting bonded structure, at least part of the semiconductor substrate may be selectively etched to form channel regions for first and second transistors formed in the first and second circuit areas. For example, channel regions may be formed by using an active area mask to selectively etch at least a portion of the semiconductor substrate. In addition, the first and second bottom gate dielectric layers and the layer of bottom gate conductor material may be selectively etched using a bottom gate mask to form a bottom gate structure of a first transistor in the first circuit area and to form a bottom gate structure of a second transistor in the second circuit area. As a result, the first bottom gate dielectric layer is thicker than the second bottom gate dielectric layer, but a planar double gate transistor may still be built by forming top gate structures over the channel region structures.

In another form, an integrated circuit structure and fabrication method is provided for building a planar double gate device. As formed, the integrated semiconductor structure includes a semiconductor substrate, a plurality of bottom gate dielectric layers, a substantially planar bottom gate conductor layer. The semiconductor substrate includes a first circuit area over a first plurality of double gate transistors are to be formed, and also includes a second circuit area over which a second plurality of double gate transistors are to be formed. In addition, the semiconductor substrate may also include a cleaving layer formed by implanting a dopant into the semiconductor substrate, where the cleaving layer may be used to separate and remove part of the semiconductor substrate. The plurality of bottom gate dielectric layers is formed over the substrate, and includes a first relatively thinner bottom gate dielectric layer formed over the first circuit area, and a second relatively thicker bottom gate dielectric layer formed over the second circuit area. Additional bottom gate dielectric layers having different thicknesses and/or materials may also be obtained for use in the fabrication of double gate transistors in other circuit areas. The different gate dielectric layers may be formed from the same or different materials, and may each be formed with different processes (e.g., dielectric growth and deposition).

In another form, a method of forming double gate transistors having different gate dielectric thicknesses is provided. A first wafer structure having a plurality of circuit areas is provided, where the first wafer structure includes at least a bottom gate conductive layer, a bottom gate dielectric layer and a semiconductor layer formed over the bottom gate dielectric layer. As formed, the bottom gate dielectric layer is grown or deposited over a first circuit area with a first dielectric formation step for a first thickness and/or material, and is grown or deposited over a second circuit area with a combination of the first dielectric formation step and a second dielectric formation step. The double gate transistors may be completed by selectively etching top gate conductor layer, top gate dielectric layer, the channel layer to form channel region, the bottom gate dielectric layer and the bottom gate conductor layer to form top gate structures and forming bottom gate structures for the first plurality of double gate transistors formed over the first circuit area and for the second plurality of double gate transistors formed over the second circuit area.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. For example, bottom or top gate dielectric layers having different thicknesses and/or materials may be fabricated by forming one or more dielectric layers, with or without masking layer (e.g., silicon nitride), over the different circuit areas, and then selectively etching back the dielectric and/or masking layer over a first circuit area to a first desired thickness using a selective etch and/or masking process, while leaving the original dielectric layer thickness over a second circuit area.

Due to the differences of the dielectric constant of different dielectric film materials (e.g., oxide, oxynitride, high-k insulator film), the electrical effective thickness of bottom and/or top gate dielectric layer can be achieved with different materials, even when these different materials have the same physical thickness. For the purpose of transistor threshold voltage control, the effective thickness can be controlled by using different gate dielectric thicknesses, by using materials having different dielectric constants, or by using a combination of different material having different thicknesses.

Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making double gate transistors on an integrated circuit having a plurality of circuit areas of predetermined gate dielectric effective thicknesses, comprising:
   providing a first wafer, said first wafer having a first side and a second side, said first wafer comprising a first semiconductor substrate structure at the first side;
   forming a first dielectric layer over first, second and third circuit areas on the first side;
   removing the first dielectric layer from the first circuit area;
   forming a second dielectric layer over the first, second and third circuit areas;
   removing the second dielectric layer from the first circuit area;
   forming a final dielectric layer of a substantially uniform thickness over the first and second circuit areas on the first side, thereby forming a plurality of bottom gate dielectric layers, comprising:
      a first bottom gate dielectric layer over the first circuit area comprised of the final dielectric layer,
      a second bottom gate dielectric layer over the second circuit area comprised of the first, second and final dielectric layers, and
      a third bottom gate dielectric layer over the third circuit area comprised of the first and second dielectric layers;
   forming a substantially planar layer of bottom gate conductor material on the first side;
   bonding the first side of the first wafer to a second wafer;
   forming a top gate layer over and insulated from the first semiconductor substrate structure; and
   forming a plurality of self-aligned top gate structures, channel regions, and bottom gate structures by using an active area mask to selectively etch the top gate layer to form the plurality of top gate structures which are used as a mask to selectively etch the first semiconductor substrate structure and the plurality of bottom gate dielectric layers and the layer of bottom gate conductor material;
   whereby each of the bottom gate dielectric layers has predetermined effective thicknesses.

2. The method of claim 1, where the first dielectric layer or the final dielectric layer are formed by depositing a layer of high-k dielectric material.

3. The method of claim 1, where the first dielectric layer or the final dielectric layer are formed by growing a layer of dielectric material.

4. The method of claim 1, where forming a plurality of self-aligned top gate structures, channel regions, and bottom gate structures comprises applying a photoresist masking process to selectively mask and etch at least a portion of the top gate layer to form a plurality of top gate structures which are separated from the channel regions by a plurality of top gate dielectric layers.

5. The method of claim 1, where removing the first dielectric layer from the first circuit area comprises:
   patterning the first dielectric layer with a first patterned layer to mask the second circuit area; and
   removing the first dielectric layer from the first circuit area.

6. The method of claim 1 wherein the layer of bottom gate conductor material comprises polysilicon, silicide, or a metal gate stack.

7. The method of claim 1, further comprising removing a first portion of the first semiconductor substrate structure to leave a layer of the first semiconductor substrate structure after the bonding.

8. The method of claim 7, wherein the removing further comprises:
   implanting a dopant in the first semiconductor substrate structure to create a stress layer in the first semiconductor substrate structure; and
   separating the first portion from the layer of the first semiconductor substrate structure at the stress layer.

9. The method of claim 1, where the second wafer comprises a multi layered composite film wafer substrate comprising a noise reduction shielding conductor plate.

10. The method of claim 1, where the second wafer comprises a second semiconductor substrate structure formed under a first insulator layer.

* * * * *